(12) United States Patent
Onishi

(10) Patent No.: US 9,692,440 B1
(45) Date of Patent: Jun. 27, 2017

(54) CIRCUIT FOR GENERATING A REFERENCE CURRENT PROPORTIONAL TO SQUARE OF CLOCK FREQUENCY

(71) Applicant: SEMICONDUCTOR COMPONENTS INDUSTRIES, LLC, Phoenix, AZ (US)

(72) Inventor: Akinobu Onishi, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/160,250

(22) Filed: May 20, 2016

(51) Int. Cl.
    *H03M 1/34*     (2006.01)
    *H03K 17/22*     (2006.01)
    *H03M 3/00*     (2006.01)
    *G05F 3/26*     (2006.01)

(52) U.S. Cl.
    CPC .............. *H03M 1/34* (2013.01); *G05F 3/262* (2013.01); *H03K 17/223* (2013.01); *H03M 3/464* (2013.01)

(58) Field of Classification Search
    CPC ...... H03M 1/1057; H03M 1/742; H03M 1/12; H03M 1/52; H03M 1/1019; H03M 1/1028; H03M 1/1225; H03M 1/145; H03M 1/181; H03M 3/43; H03M 3/62; H03M 3/454; H03M 3/448; H03M 3/494
    USPC ................................................ 341/140–165
    See application file for complete search history.

(56) References Cited

U.S. PATENT DOCUMENTS

| | | | | |
|---|---|---|---|---|
| 4,268,820 A * | 5/1981 | Hareyama | ........... | H03M 1/0658 324/99 D |
| 5,321,403 A * | 6/1994 | Eng, Jr. | .................. | H03M 1/162 341/120 |
| 5,565,869 A * | 10/1996 | Brodie | .................. | H03M 1/162 341/129 |
| 5,612,698 A * | 3/1997 | Reay | ..................... | H03M 1/181 341/155 |
| 5,621,406 A * | 4/1997 | Goetzinger | ......... | H03M 1/1009 341/118 |
| 6,426,713 B1 * | 7/2002 | Amar | .................. | H03M 1/1028 341/118 |
| 6,771,696 B1 * | 8/2004 | Tuttle | .................. | H04L 25/0266 375/222 |
| 9,423,438 B2 * | 8/2016 | Lin | ..................... | G01R 27/2623 |
| 2002/0041217 A1 | 4/2002 | Crofts et al. | | |
| 2005/0093725 A1 * | 5/2005 | McDaniel | ........... | H03M 1/1057 341/143 |
| 2007/0290896 A1 * | 12/2007 | Hong | .................... | H03M 3/362 341/50 |
| 2008/0212347 A1 | 9/2008 | Mok et al. | | |

(Continued)

FOREIGN PATENT DOCUMENTS

| | | |
|---|---|---|
| JP | 2005-286821 | 10/2005 |
| JP | 2006-135377 | 5/2006 |

(Continued)

*Primary Examiner* — Lam T Mai
(74) *Attorney, Agent, or Firm* — Conley Rose, P.C.

(57) ABSTRACT

An analog-to-digital conversion system, in some embodiments, comprises: a plurality of integrators coupled to each other, each of said integrators requiring a reference current; and a reference current generation circuit that generates said reference current for the plurality of integrators, the reference current is proportional to the square of the frequency of a clock signal of the reference current generation circuit.

20 Claims, 7 Drawing Sheets

(56) References Cited

U.S. PATENT DOCUMENTS

2008/0284406 A1 11/2008 Kapusta, Jr.
2009/0189586 A1 7/2009 Tiew

FOREIGN PATENT DOCUMENTS

| JP | 2014-207569 | 10/2014 |
|---|---|---|
| JP | 2015-012377 | 1/2015 |

* cited by examiner

CIRCUIT FOR GENERATING A REFERENCE CURRENT PROPORTIONAL TO SQUARE OF CLOCK FREQUENCY

BACKGROUND

Analog-to-digital converters (ADCs) are commonly used in a variety of electronic devices—such as the digital microelectromechanical (MEMS) microphone integrated circuit—to convert incoming analog signals to digital outputs. The ADCs typically contain a series of switched-capacitor integrators that require a reference current to operate properly. However, the reference current that is required varies based on the operating frequency of the ADC. The typical ADC has a substantially wide operating frequency range, but the reference current produced at each frequency in this range is not always the optimal current for that particular frequency. This results in suboptimal performance of the ADC and, by extension, of the electronic device within which the ADC is contained.

SUMMARY

At least some embodiments are directed to an analog-to-digital conversion system, comprising: a plurality of integrators coupled to each other, each of said integrators requiring a reference current; and a reference current generation circuit that generates said reference current for the plurality of integrators, the reference current is proportional to the square of the frequency of a clock signal of the reference current generation circuit. These embodiments may be supplemented using one or more of the following concepts, in any order and in any combination: wherein the reference current generation circuit comprises at least two equally-sized MOSFETs of the same type and a switched-capacitor resistor including two equally-sized capacitors, and wherein at least one of said MOSFETs produces the reference current; wherein the reference current generation circuit comprises a switched-capacitor resistor that includes a plurality of switches and multiple capacitors, each of said switches controlled by said clock signal or by another clock signal; wherein the clock signals have a phase offset of 180 degrees; wherein said plurality of switches includes a first pair of switches that couple to a MOSFET in the reference current generation circuit, and the plurality of switches further includes a second pair of switches that couple to ground, and wherein each of the switches in the first pair is controlled by a different one of said clock signals, and wherein each of the switches in the second pair is controlled by a different one of said clock signals; wherein the reference current generation circuit comprises another capacitor coupled in parallel to the switched-capacitor resistor; wherein the reference current equals:

$$\frac{8}{\mu_N (Cox)\left(\frac{W}{L}\right)_{MN1}} \left(1 - \frac{1}{\sqrt{K}}\right)^2 (C^2 f^2)$$

wherein $\mu$ is electron mobility for a MOSFET in the reference current generation circuit, Cox is gate oxide film capacitance per unit area for said MOSFET, W/L is the aspect ratio for said MOSFET, K is the size ratio of said MOSFET to another MOSFET in the reference current generation circuit, C is the capacitance of equally-sized multiple capacitors in a switched-capacitor resistor within the reference current generation circuit, and f is the frequency of the clock signal.

At least some embodiments are directed to a reference current generation circuit for a delta-sigma analog-to-digital converter, comprising: a switched-capacitor resistor having multiple switches controlled by a clock signal and including multiple capacitors coupled to at least some of said switches; a first MOSFET coupled to the switched-capacitor resistor and to a different capacitor; a second MOSFET coupled to the first MOSFET and further coupled to said different capacitor, said first and second MOSFETS of the same type; a third MOSFET coupled to the first MOSFET, to a fourth MOSFET, and to said different capacitor, said fourth MOSFET coupled to the second MOSFET and being of the same type as the third MOSFET; and a fifth MOSFET of the same type as the third and fourth MOSFETs, coupled to the third MOSFET and producing a reference current, wherein the reference current is proportional to the square of the frequency of the clock signal. These embodiments may be supplemented using one or more of the following concepts, in any order and in any combination: further comprising another capacitor coupled to the first MOSFET and to a node at which two of the multiple switches couple to each other, such that said another capacitor is in parallel with the switched-capacitor resistor; wherein the fifth MOSFET is coupled to a current mirror that mirrors said reference current; wherein each of the multiple switches is controlled by said clock signal or by a different clock signal, and wherein the clock signals have the same frequency; wherein the phases of the clock signals are offset by 180 degrees; wherein said multiple capacitors in the switched-capacitor resistor are equally sized; wherein the third and fifth MOSFETs are equally sized; wherein the reference current equals:

$$\frac{8}{\mu_N (Cox)\left(\frac{W}{L}\right)_{MN1}} \left(1 - \frac{1}{\sqrt{K}}\right)^2 (C^2 f^2)$$

wherein $\mu$ is electron mobility for the second MOSFET, Cox is gate oxide film capacitance per unit area for the second MOSFET, W/L is the aspect ratio for the second MOSFET, K is the size ratio of the first MOSFET to the second MOSFET, C is the capacitance of the equally-sized multiple capacitors in the switched-capacitor resistor, and f is the frequency of the clock signal; further comprising a low-pass filter positioned between the third and fifth MOSFETs; wherein the low-pass filter comprises a plurality of resistors and a plurality of capacitors, each of said capacitors coupled between a different pair of said resistors; wherein the fifth MOSFET couples to a sixth MOSFET, said sixth MOSFET emits a constant current that combines with the reference current to produce a modified reference current; wherein the constant current is produced independent of the frequency of the clock signal; wherein the second and fourth MOSFETs couple to a startup circuit, and wherein the startup circuit comprises: a first p-type MOSFET coupled to a second p-type MOSFET; a capacitor coupled to the second p-type MOSFET; a third p-type MOSFET coupled to the capacitor; a first n-type MOSFET coupled to the third p-type MOSFET and coupled to the first p-type MOSFET; and a second n-type MOSFET coupled to the second p-type MOSFET and coupled to the first n-type MOSFET.

BRIEF DESCRIPTION OF THE DRAWINGS

There are disclosed in the drawings and in the following description systems for generating a reference current that is proportional to the square of the clock frequency. In the drawings.

Figure 1:
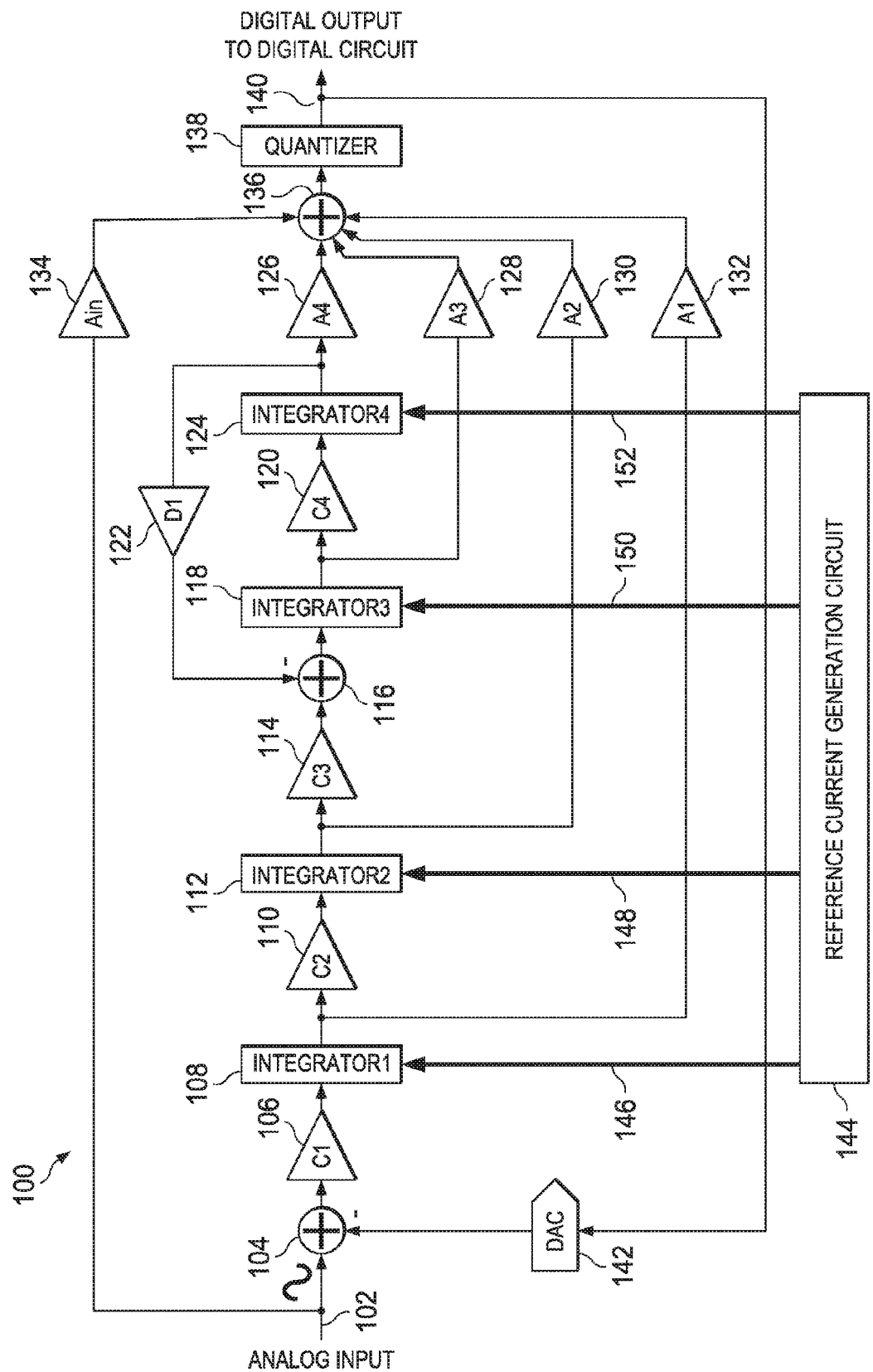
FIG. 1 is a block diagram of a delta-sigma modulator configuration within an analog-to-digital converter (ADC).

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein is a reference current generation circuit (RCGC) that generates and provides an optimal reference current to a delta-sigma modulator in an analog-to-digital converter (ADC). The reference current provided is optimized based on the operating frequency of the ADC. More specifically, the reference current provided is proportional to the square of the clock signal frequency used in the ADC. Thus, the RCGC is able to generate an optimal current even when the optimal current needed varies with the clock signal frequency in a non-linear fashion.

FIG. 1 is a block diagram of a fourth-order delta-sigma modulator 100 within an analog-to-digital converter (ADC). The modulator 100 receives an analog input signal 102, which is combined at combination unit 104 with the output of a digital-to-analog converter (DAC) 142. The output of the combination unit 104 couples to coefficient unit 106, the output of which couples to integrator 108. The output of the integrator 108 couples to coefficient unit 110 and to coefficient unit 132. The output of coefficient unit 110 couples to integrator 112, the output of which couples to both coefficient unit 114 and to coefficient unit 130. The output of coefficient unit 114 couples to combination unit 116, which also receives the output of the coefficient unit 122. The output of combination unit 116 couples to integrator 118, the output of which is provided to coefficient unit 120 and coefficient unit 128. The output of coefficient unit 120 couples to integrator 124, the output of which couples to coefficient unit 126 and to coefficient unit 122. The output of coefficient unit 126 couples to combination unit 136, which also receives the outputs of coefficient units 128, 130 and 132. The combination unit 136 also receives the analog input via coefficient unit 134. The output of combination unit 136 couples to a 1-bit quantizer 138, the digital output of which couples to node 140. Node 140 couples in a feedback loop to DAC 142. As the basic operation of delta-sigma modulators is known in the art, such operation is not described in detail here.

Each of the integrators 108, 112, 118 and 124 operates using a reference current. This reference current is provided by the reference current generation circuit (RCGC) 144, which couples to the integrators 108, 112, 118 and 124 via outputs 146, 148, 150 and 152, respectively. As described below, the RCGC 144 generates the reference current proportional to the square of the frequency of the clock signal that the sigma-delta modulator 100 uses to operate. Stated another way, the clock frequency of the analog-to-digital converter within which the sigma-delta modulator is housed is identical to the clock frequency supplied to the RCGC 144. Such a clock signal may be provided from, for instance and without limitation, an external source in the electronic device within which the modulator 100 is housed.

Figure 2:
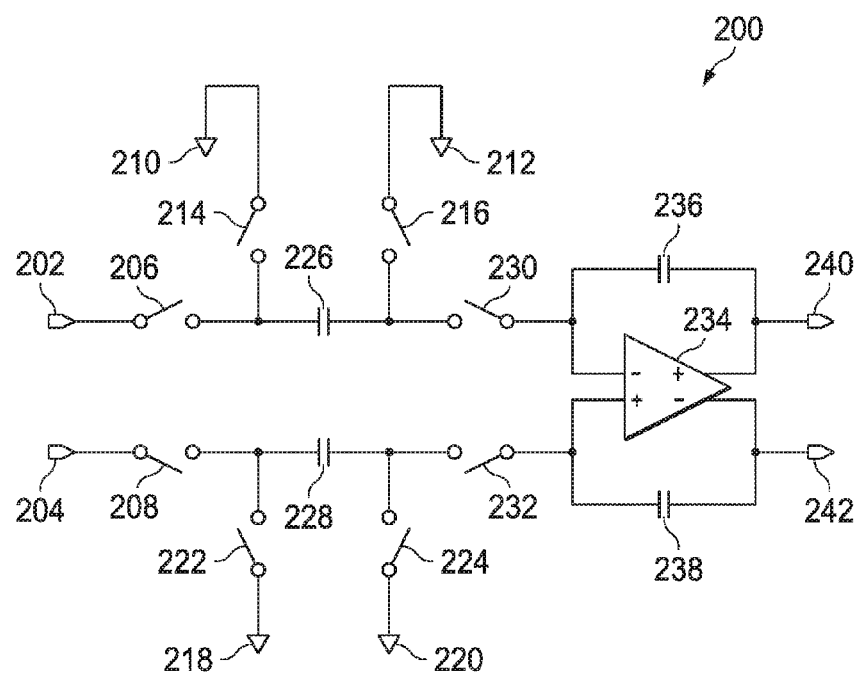
FIG. 2 is a circuit schematic diagram of an integrator found within a delta-sigma modulator.

FIG. 2 is a circuit schematic diagram of an integrator 200 found within a delta-sigma modulator. The integrator 200 is illustrative of the integrators 108, 112, 118 and 124 shown in FIG. 1, although these integrators are not limited to the specific configuration of integrator 200. The integrator 200 comprises input connections 202 and 204; switches 206 and 208; identical reference voltage connections 210, 212, 218 and 220; capacitors 226 and 228; switches 230 and 232; operational amplifier 234; capacitors 236 and 238 coupled in feedback loops on the amplifier 234; and output connections 240 and 242. As integrators are commonly used in the art, the operation of the integrator 200 is not described in detail here.

Figure 3A:
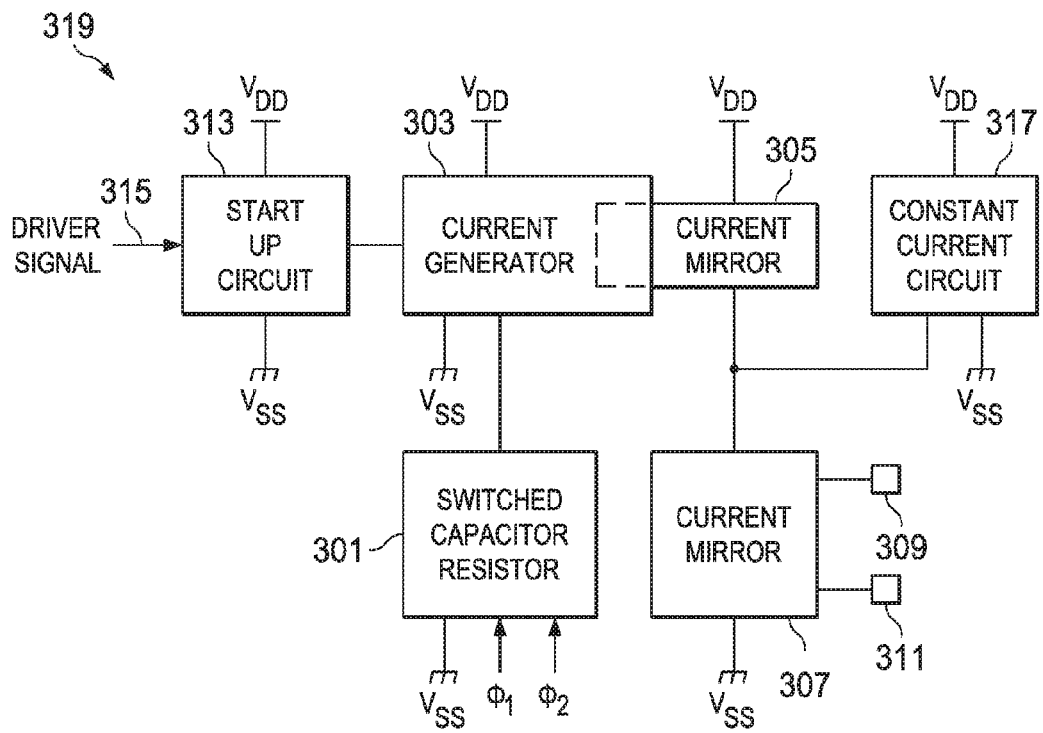
FIG. 3A is a generic block diagram of a reference current generation circuit.

FIG. 3A is a block diagram of a reference current generation circuit (RCGC) 319. The RCGC 319 is a genericized version of the more specific circuit schematics of FIGS. 3B and 4-6, each of which is described in detail below. The RCGC 319 comprises a switched capacitor resistor 301 receiving multiple clock signal inputs $Ø_1$ and $Ø_2$; a current generator 303; a current mirror 305 that contains circuitry shared with the current generator 303; a current mirror 307; and reference current output nodes 309 and 311. These components of the RCGC 319 are depicted in greater detail in FIG. 3B. The RCGC 319 optionally includes a constant current circuit 317, and this circuit is described in greater detail with respect to FIGS. 4 and 5. The RCGC 319 also optionally includes a start-up circuit 313 having a driver signal input 315, and this optional feature is described in greater detail with respect to FIG. 5. A $V_{DD}$ connection is provided to components 303, 305, 313 and 317. A $V_{SS}$ connection is provided to components 301, 303, 307, 313 and 317. The switched capacitor resistor 301 includes multiple switches and capacitors. The current generator 303 includes a network of MOSFETs. The current mirror 305 includes a low-pass filter and multiple MOSFETs. The current mirror 307 comprises multiple MOSFETs. The constant current circuit 317 includes any suitable circuit that generates a highly precise, constant current that is generally unsusceptible to system battery voltage fluctuations. The start-up circuit 313 includes a capacitor and multiple MOSFETs. Illustrative circuitry for each of these components is provided in FIGS. 3B and 4-6.

In operation, the switched capacitor resistor 301 receives the two phase-offset clock signal inputs $Ø_1$ and $Ø_2$ (described in greater detail below with respect to FIG. 3C) and, based on these signals and its internal capacitances, provides a resistance. In turn, the current generator 303 produces a current that depends on the value of the resistance provided by the switched capacitor resistor 301. The current mirrors 305 and 307 mirror the current of the current generator 303 and produce a reference current. This reference current is output on the nodes 309 and 311. Some embodiments contain a constant current circuit 317, which provides a highly precise, minimum, constant current to the reference current. The current is generally unsusceptible to fluctuations in system battery voltage. Finally, some embodiments contain a start-up circuit 313 that receives a driver signal 315. The start-up circuit facilitates a smooth, fast startup for the RCGC 319 by causing $V_{DD}$ to come down quickly and $V_{SS}$ to come up quickly so that transistors in the current generator 303 start up simultaneously and quickly. The RCGC 319 is now described in greater detail with respect to FIGS. 3B-5. FIG. 6 also relates to the RCGC 319, but in FIG. 6, the RCGC has its $V_{DD}$ and $V_{SS}$ connections reversed relative to FIGS. 3B-5, as described in detail below.

Figure 3C:
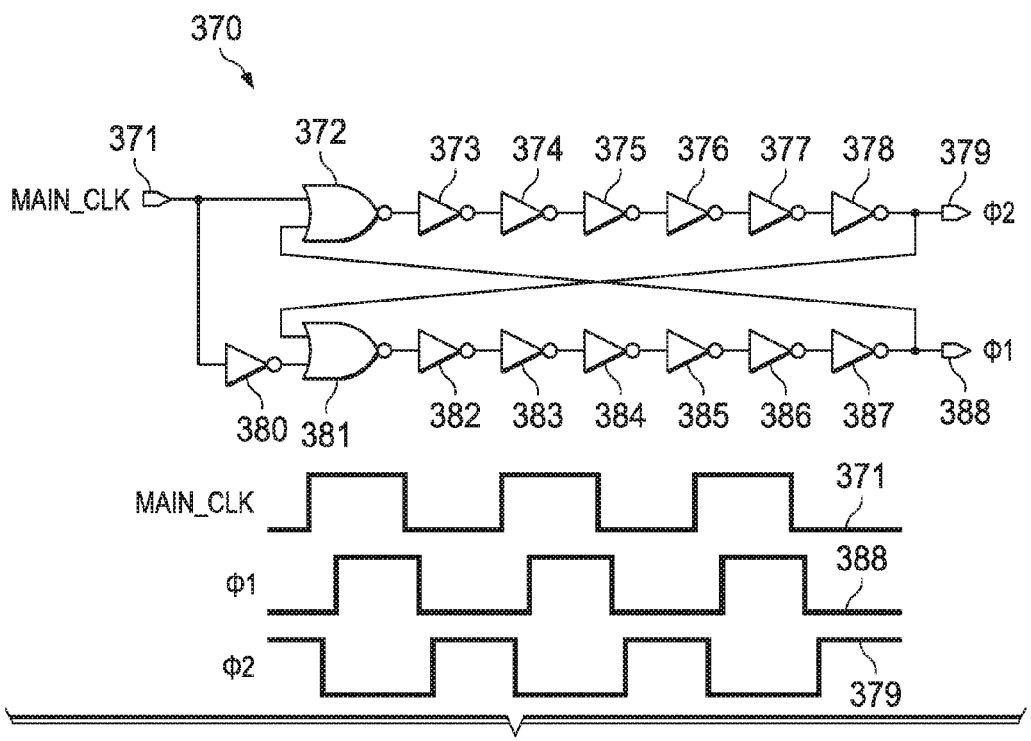
FIG. 3C is a circuit schematic diagram of a system usable to produce two clock signals from a primary clock signal.
Figure 3B:
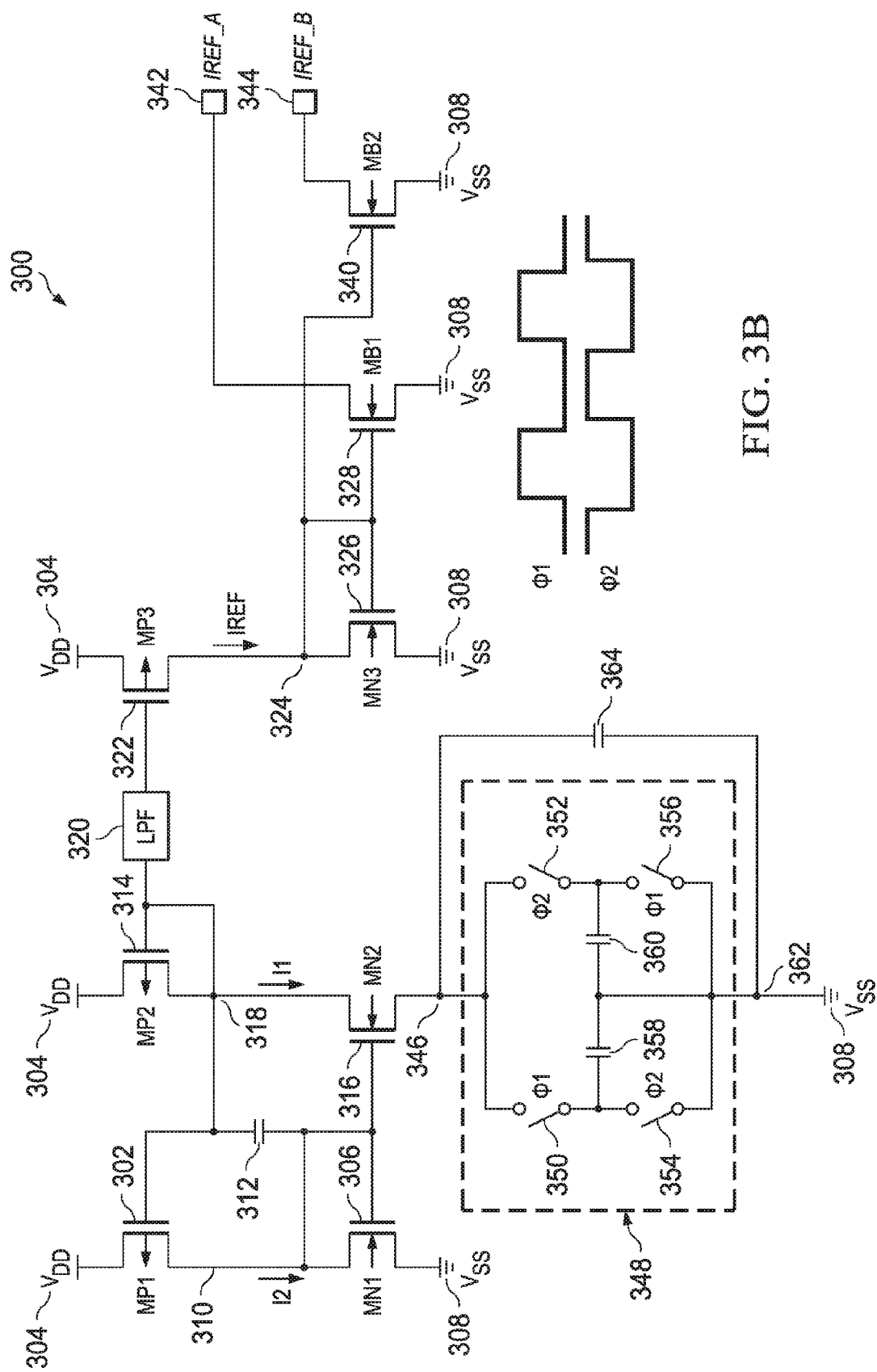
FIG. 3B is a circuit schematic diagram of a reference current generation circuit.

FIG. 3B is a circuit schematic diagram of an RCGC 300. The RCGC 300 is illustrative of the RCGC 144 shown in FIG. 1, but the RCGC 144 is not limited to the specific configuration of RCGC 300. The RCGC 300 comprises a p-type metal oxide semiconductor field effect transistor (MOSFET) 302; a plurality of $V_{DD}$ connections 304; an n-type MOSFET 306 coupled to the MOSFET 302; a plurality of $V_{SS}$ connections 308; a node 310 coupled to the MOSFETs 302 and 306; a capacitor 312 (e.g., 0.5 pico-Farads) coupled to the MOSFETs 302 and 306 and to the node 310; a p-type MOSFET 314 coupled to the MOSFET 302 and capacitor 312; an n-type MOSFET 316 coupled to all aforementioned MOSFETs and to the capacitor 312; a node 318 coupled to MOSFETs 302, 314 and 316 and to capacitor 312; a low-pass filter 320 coupled to the MOSFET 314 and node 318; a p-type MOSFET 322 coupled to the low-pass filter 320; a node 324 coupled to the MOSFET 322; an n-type MOSFET 326 coupled to the node 324; n-type MOSFETS 328 and 340 coupled to the node 324; a first mirrored current connection 342; a second mirrored current connection 344; a node 346 coupled to MOSFET 316; a switched-capacitor resistor 348 coupled to the node 346; a switch 350 controlled by a clock signal $Ø_1$ and coupled to node 346; a switch 352 controlled by a clock signal $Ø_2$ and coupled to node 346 and switch 350; a switch 354 controlled by the clock signal $Ø_2$ and coupled to switch 350; and a switch 356 controlled by the clock signal $Ø_1$ and coupled to switches 352 and 354. The RCGC 300 further includes capacitors 358 (e.g., 2.3 pico-Farads) and 360 (e.g., 2.3 pico-Farads), which couple to each other. The capacitor 358 further couples to switches 350, 354 and 356, and the capacitor 360 couples to switches 352, 354 and 356. A node 362 couples to the switches 354 and 356 and to capacitors 358 and 360. A capacitor 364 (e.g., 10 pico-Farads) couples to nodes 346 and 362 (i.e., it is in parallel with the switched-capacitor resistor 348). In FIG. 3B, as in all figures herein, MOSFETs of any type may be exchanged for MOSFETs of any other type as may be suitable, regardless of whether any such MOSFET types are expressly described herein.

FIG. 3B shows a timing diagram of the two clock signals $Ø_1$ and $Ø_2$. The two clock signals have phases that are offset by 180 degrees, but they have identical frequencies. As shown, each pulse is preceded and followed by a period during which neither clock signal produces a pulse. When $Ø_1$ is high and $Ø_2$ is low, the switches 350 and 356 are closed and the switches 352 and 354 are open. In this situation, the node 346 couples to the capacitor 358, but the capacitor 360 is shorted. Thus, the capacitor 358 is essentially placed in parallel with the capacitor 364. Similarly, when $Ø_2$ is high and $Ø_1$ is low, the switches 350 and 356 are open and the switches 352 and 354 are closed. In this scenario, the node 346 couples to the capacitor 360, but the capacitor 358 is shorted. Whichever of the two capacitors 358 and 360 is not shorted at any given time acts as a resistor. Assuming that these two capacitors are equally sized and that the frequencies of $Ø_1$ and $Ø_2$ are identical, the equivalent resistance value RES in the switched capacitor resistor 348 is:

$$RES = \frac{1}{2Cf} \quad (1)$$

where C is the common capacitance of capacitors 358 and 360 and f is the common frequency of the clock signals $Ø_1$ and $Ø_2$. The value of RES directly impacts the values of the currents I1 and I2, which, in turn, directly impact the value of the reference current produced by the RCGC 300. Accordingly, the manner in which the currents I1 and I2 depend on the value of RES is now described.

The drain current formula for a MOSFET in the saturation region is given by:

$$I = \frac{1}{2}\mu(Cox)\frac{W}{L}(V_{gs} - V_{th})^2 \quad (2)$$

where µ is mobility, Cox is the gate oxide film capacitance per unit area, W/L is the aspect ratio, $V_{gs}$ is the voltage across the gate and source, and $V_{th}$ is the threshold voltage. The value of $V_{gs}$ is given by the expression:

$$V_{gs} = \sqrt{\frac{2I}{\mu(Cox)\frac{W}{L}}} + V_{th} \quad (3)$$

This expression may be substituted into the following expression for $V_{gsMN1}$ and $V_{gsMN2}$:

$$V_{gsMN2} + I1(RES) = V_{gsMN1} \quad (4)$$

where $V_{gsMN2}$ is the gate-source voltage for the MOSFET 316, $V_{gsMN1}$ is the gate-source voltage for MOSFET 306, I1 is the current flowing between node 318 and the MOSFET 316, and RES is defined above. Thus, substituting (3) for $V_{gsMN1}$ and $V_{gsMN2}$ in (4), the following expression is produced:

$$\sqrt{\frac{2(I1)}{\mu_N(Cox)\left(\frac{W}{L}\right)_{MN2}}} V_{thMN2} + I1(Res) = \\ \sqrt{\frac{2(I2)}{\mu_N(Cox)\left(\frac{W}{L}\right)_{MN1}}} + V_{thMN1} \quad (5)$$

where MN2 refers to the MOSFET 316, MN1 refers to the MOSFET 306, and I2 is the current flowing between node 310 and the MOSFET 306.

If the substrate bias is ignored, the threshold voltages for the MOSFETs 306 and 316 are equivalent:

$$I1(RES) = \sqrt{\frac{2(I1)}{\mu_N(Cox)\left(\frac{W}{L}\right)_{MN1}}} * \left(1 - \frac{1}{\sqrt{K}}\right) \quad (6)$$

where the size ratio of MOSFET 306 to MOSFET 316 is 1:K, and assuming that the currents I2 and I1 are equivalent when MOSFETs 302 and 314 are equally sized (i.e., their channel lengths, channel widths, threshold voltages, etc. are the same or within 10% of each other). Solving for I1 produces:

$$I1 = \frac{2}{\mu_N (Cox)\left(\frac{W}{L}\right)_{MN1}} * \left(\frac{1}{RES}\right)^2 * \left(1 - \frac{1}{\sqrt{K}}\right)^2 \quad (7)$$

In this way, I1 depends on the RES of the switched capacitor resistor 348. Further, as explained above, I2=I1 when the MOSFETs 302 and 314 are equally sized. Thus, the calculation of I1 yields I2 as well.

The reference current produced by the RCGC 300 is denoted by IREF and is shown in FIG. 3B flowing between MOSFET 322 and node 324. This current IREF is equivalent to the current I1 when the MOSFETs 314 and 322 are equally sized. Thus, calculating I1 produces I2 and, by extension, IREF. Accordingly, assuming that (7) is equivalent to IREF and substituting (1) for RES produces:

$$IREF = \frac{8}{\mu_N (Cox)\left(\frac{W}{L}\right)_{MN1}} * \left(1 - \frac{1}{\sqrt{K}}\right)^2 * C^2 * f^2 \quad (8)$$

In this way, a reference current IREF is produced that is proportional to the square of the clock frequency provided to the RCGC 300. The reference current is thus optimized across a wide range of operating frequencies and facilitates superior operation of the integrators in the delta-sigma modulator 100. In at least some embodiments, the RCGC 300 does not require additional clock signals for current control because the reference current is optimized using only the clock frequency.

The MOSFETs 326, 328 and 340 form current mirrors to produce IREF at connections 342 and 344. Specifically, the drain current for a MOSFET is typically a function of the $V_{DG}$ and $V_{GS}$ of the MOSFET. If the $V_{DG}$=0 because of a short, then the drain current is a function of $V_{GS}$. In this case, the drain current for MOSFET 326 (IREF) is known and is produced as described above, so the value of $V_{GS}$ for MOSFET 326 is dictated by IREF. The $V_{GS}$ for MOSFET 326 is the same as the $V_{GS}$ for MOSFETs 328 and 340, since their gates are coupled together and their sources couple to $V_{SS}$ 308. Thus, IREF sets the $V_{GS}$ for all of the MOSFETs 326, 328 and 340. The $V_{GS}$ values for MOSFETs 328 and 340 dictate the drain currents for these two MOSFETs, which are produced at connections 342 and 344 as mirrored currents. The current mirrors for the remaining embodiments described herein function similarly, although the scope of disclosure is not limited to this particular current mirror configuration.

Regarding the remaining portions of FIG. 3B not yet described, the capacitor 312 prevents oscillation of the reference circuit, the low-pass filter 320 reduces noise in the signal, and the capacitor 364 has a smoothing effect on the potential across the switched capacitor resistor 348.

FIG. 3C is a circuit schematic diagram of a system 370 usable to produce the two clock signals Ø$_1$ (numeral 388) and Ø$_2$ (numeral 379) from a primary clock signal MAIN_CLK 371. The system 370 includes a NOR gate 372, a series of inverters 373-378, an inverter 380, a NOR gate 381, and a series of inverters 382-387. The NOR gate 372 receives as input the main clock signal 371 and the output of inverter 387. The NOR gate 381 receives as input the inverted version of the main clock signal 371 and the output of inverter 378. The system 370 receives and outputs clock signals as shown in the timing diagram. The clock signals 388 and 379 have phases offset by 180 degrees from each other, and they are both slightly phase-offset from the main signal 371. The frequencies of the three signals, however, are identical. In at least some embodiments, the frequency ranges between 768 kHz and 4.8 MHz, but the scope of this disclosure is not limited to any particular frequency range. The system 370 may form part of the ADC or it may be located external to the ADC.

Figure 4:
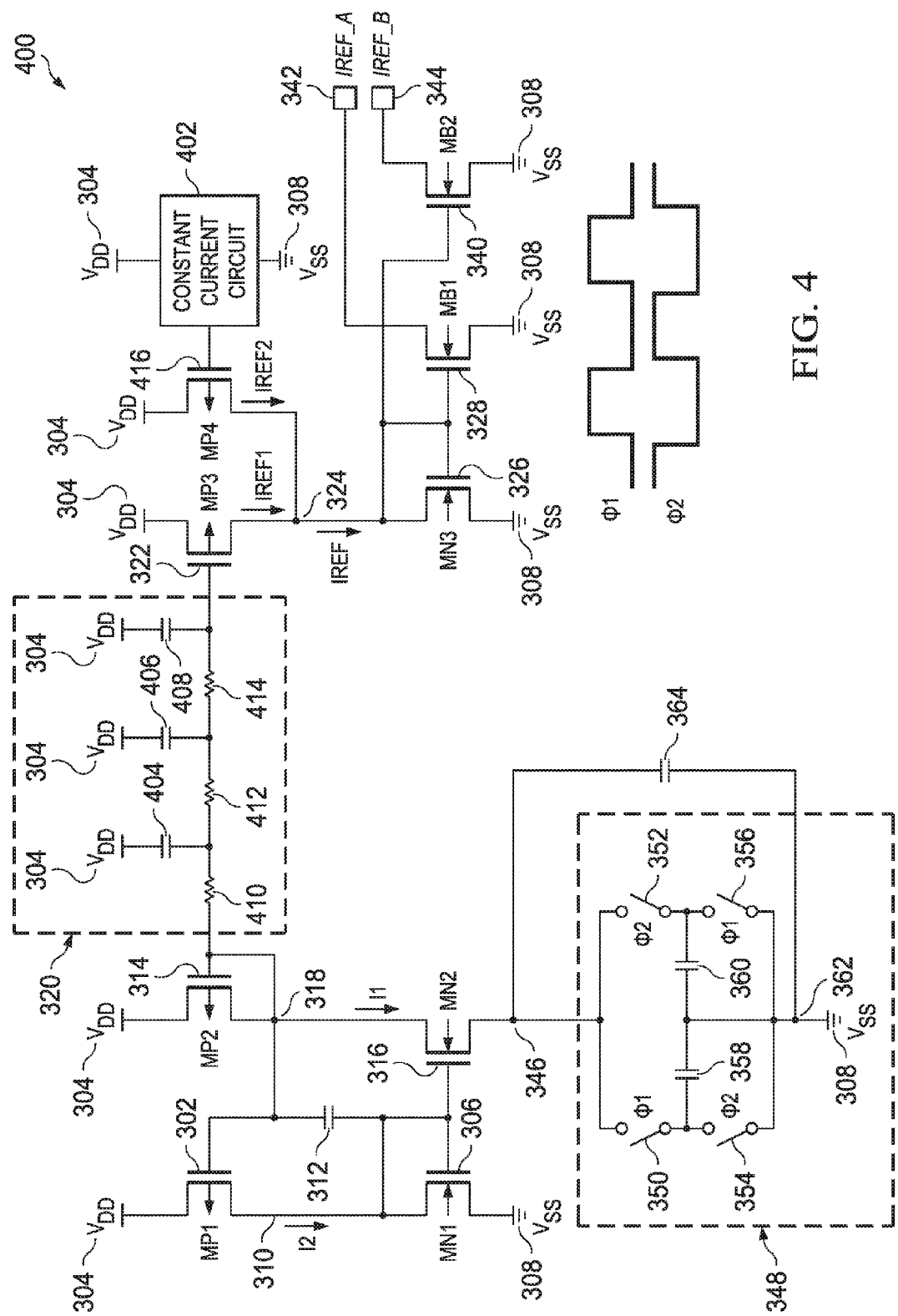
FIG. 4 is a circuit schematic diagram of a reference current generation circuit that includes a constant current circuit.

FIG. 4 is a circuit schematic diagram of a reference current generation circuit (RCGC) 400. The difference between the RCGC 400 and the RCGC 300 is that the RCGC 400 includes a constant current circuit (CCC) 402 that provides a constant current IREF2 that is independent of the clock frequency. Various types of CCCs are well known in the art, and any suitable CCC may be used for the CCC 402—for instance and without limitation, a band-gap type constant current circuit, which, generally speaking, provides a highly precise current and is less susceptible to fluctuations in the power supply voltage and manufacturing process variations. The output of the CCC 402 couples to the gate of a p-type MOSFET 416. The constant current IREF2 flows between the MOSFET 416 and the node 324. The current IREF2 combines with IREF1 (which is equivalent to the reference current IREF of FIG. 3) to produce IREF, which flows between node 324 and the drain of the n-type MOSFET 326. The CCC 402 assures a minimum current, operation of the system at very low frequencies, and quick initial operation. FIG. 4 also shows illustrative circuitry of the low-pass filter 320. Specifically, the low-pass filter 320 includes three capacitors 404 (e.g., 4 pico-Farads), 406 (e.g., 4 pico-Farads), and 408 (e.g., 4 pico-Farads) and resistors 410 (e.g., 90 kilo-Ohms), 412 (e.g., 135 kilo-Ohms), and 414 (e.g., 180 kilo-Ohms) The capacitor 404 couples to $V_{DD}$ 304 and to a node between resistors 410 and 412. Capacitor 406 couples to $V_{DD}$ 304 and to a node between resistors 412 and 414. The capacitor 408 couples to $V_{DD}$ 304 and to a node between resistor 414 and MOSFET 322.

Figure 5:
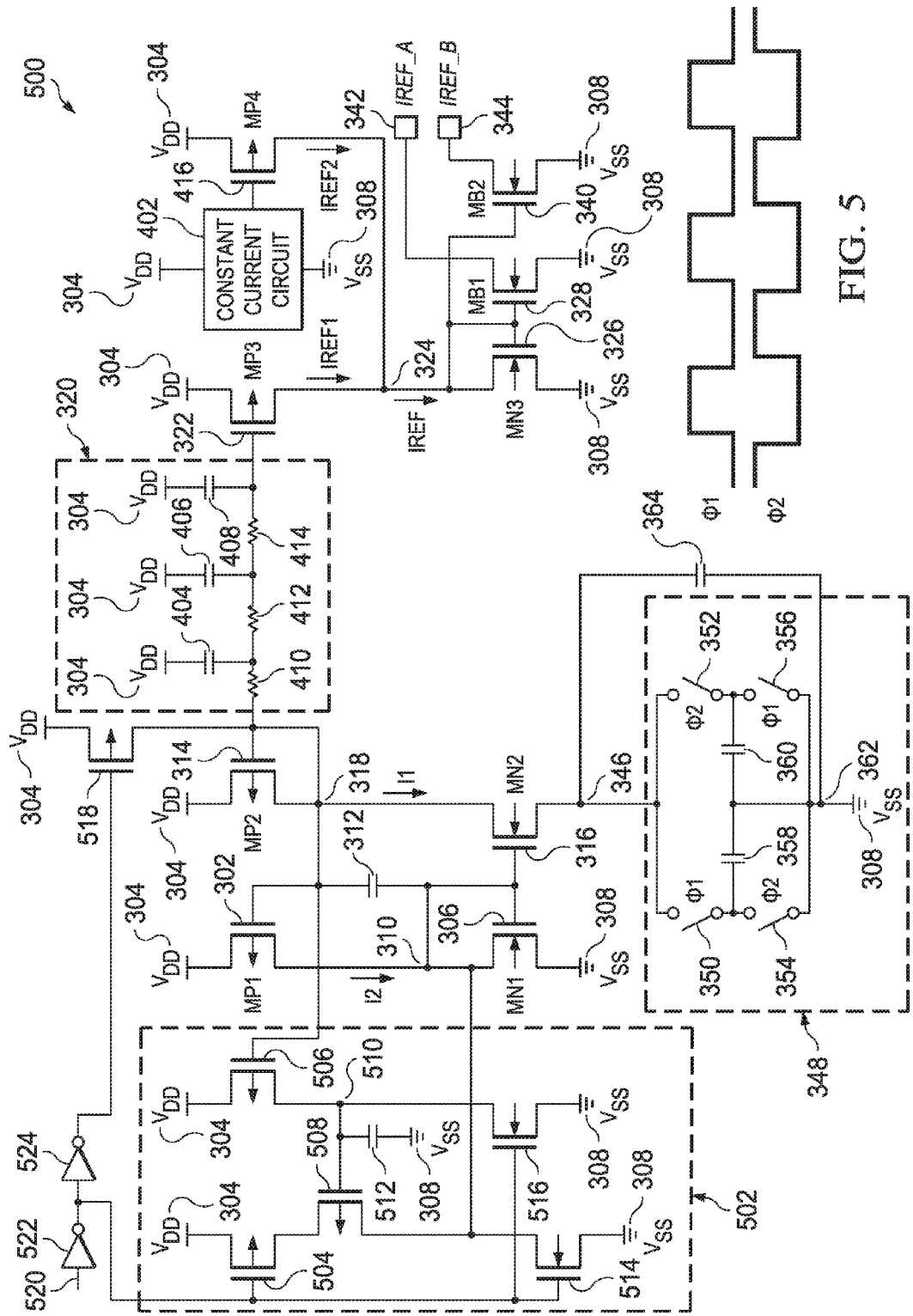
FIG. 5 is a circuit schematic diagram of a reference current generation circuit containing a start-up circuit.
Figure 6:
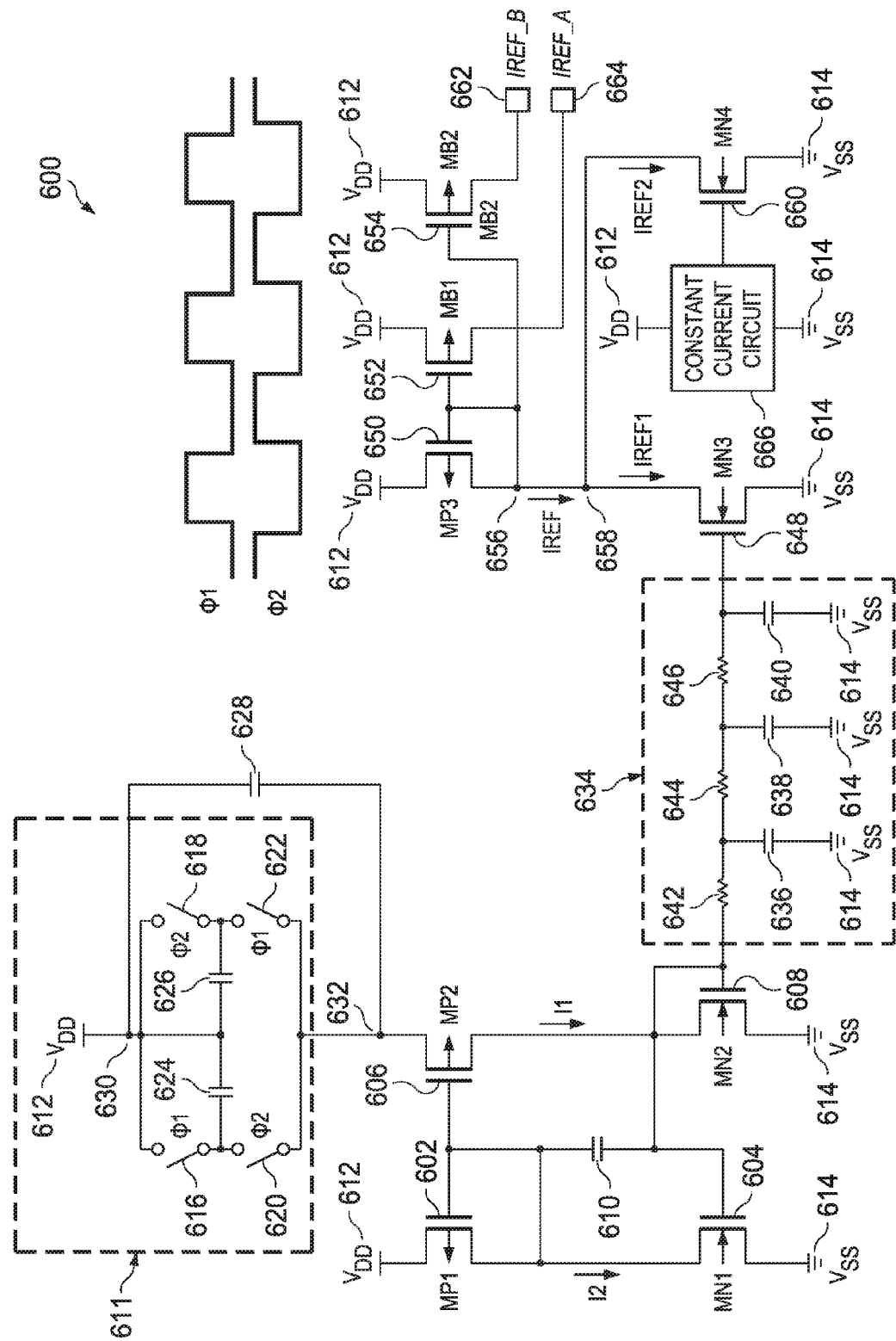
FIG. 6 is a circuit schematic diagram of another reference current generation circuit.

FIG. 5 is a circuit schematic diagram of a reference current generation circuit (RCGC) 500. The RCGC 500 differs from the RCGC 400 in that the RCGC 500 includes a start-up circuit 502 that facilitates a smooth, fast startup for the RCGC 500 by causing $V_{DD}$ to come down quickly and $V_{SS}$ to come up quickly so that MOSFETs 302 and 306 start up simultaneously and quickly. The start-up circuit 502 includes p-type MOSFETs 504, 506 and 508 and n-type MOSFETs 514 and 516. It also includes a capacitor 512 (e.g., 1 pico-Farad) coupled to $V_{SS}$ 308 and to node 510. The RCGC 500 also includes a p-type MOSFET 518, a driver signal 520 that drives the MOSFETs of the start-up circuit 502, and inverters 522 and 524. The output of inverter 522 couples to the gates of MOSFETs 504, 514 and 518. The output of inverter 524 couples to the gate of MOSFET 518. The MOSFET 518 further couples to the gate of MOSFET 314, node 318, capacitor 312, and the gate of MOSFET 506.

FIG. 6 is a circuit schematic diagram of another reference current generation circuit (RCGC) 600. The RCGC 600 is similar to the RCGC 400 of FIG. 4, but the RCGC 600 and the RCGC 400 swap their p-type MOSFETs for n-type MOSFETs and vice-versa. Similarly, the RCGC 600 and RCGC 400 swap their $V_{DD}$ connections for $V_{SS}$ connections and vice-versa. The RCGC 600 includes a p-type MOSFET 602; n-type MOSFET 604; p-type MOSFET 606; n-type MOSFET 608; capacitor 610 (e.g., 0.5 pico-Farads); $V_{DD}$ connections 612; $V_{SS}$ connections 614; switches 616, 618, 620 and 622; capacitor 624 (e.g., 2.3 pico-Farads); capacitor 626 (e.g., 2.3 pico-Farads); capacitor 628 (e.g., 10 pico-Farads); nodes 630 and 632; a low-pass filter 634 containing capacitors 636 (e.g., 4 pico-Farads), 638 (e.g., 4 pico-Farads) and 640 (e.g., 4 pico-Farads), resistors 642 (e.g., 90 kilo-Ohms), 644 (e.g., 135 kilo-Ohms), and 646 (e.g., 180 kilo-Ohms), and $V_{SS}$ connections 614; n-type MOSFET 648; p-type MOSFETs 650, 652 and 654; nodes 656 and 658 through which the reference current IREF flows; n-type MOSFET 660; mirrored reference current connections 662 and 664; and constant current circuit (CCC) 666 that produces a constant current IREF2 independent of the clock frequency. IREF2 combines with IREF1 to produce a modified reference current IREF, which is provided to the delta-sigma modulator integrators of FIG. 1. The operation of the RCGC 600 is similar to that of the RCGC 400. In some embodiments, the RCGC 600 may be modified to include a start-up circuit like that shown in RCGC 500 of FIG. 5.

Numerous other variations and modifications will become apparent to those skilled in the art once the above disclosure is fully appreciated. It is intended that the following claims be interpreted to embrace all such variations, modifications and equivalents.

What is claimed is:

1. An analog-to-digital conversion system, comprising:
a plurality of integrators coupled to each other, each of said integrators requiring a reference current; and
a reference current generation circuit that generates said reference current for the plurality of integrators, the reference current is proportional to a square of a frequency of a clock signal of the reference current generation circuit.

2. The system of claim 1, wherein the reference current generation circuit comprises at least two equally-sized MOSFETs of the same type and a switched-capacitor resistor including two equally-sized capacitors, and wherein at least one of said MOSFETs produces the reference current.

3. The system of claim 1, wherein the reference current generation circuit comprises a switched-capacitor resistor that includes a plurality of switches and multiple capacitors, each of said switches controlled by said clock signal or by another clock signal.

4. The system of claim 3, wherein the clock signals have a phase offset of 180 degrees.

5. The system of claim 4, wherein said plurality of switches includes a first pair of switches that couple to a MOSFET in the reference current generation circuit, and the plurality of switches further includes a second pair of switches that couple to ground, and wherein each of the switches in the first pair is controlled by a different one of said clock signals, and wherein each of the switches in the second pair is controlled by a different one of said clock signals.

6. The system of claim 3, wherein the reference current generation circuit comprises another capacitor coupled in parallel to the switched-capacitor resistor.

7. The system of claim 1, wherein the reference current equals:

$$\frac{8}{\mu_N (Cox) \left(\frac{W}{L}\right)_{MN1}} \left(1 - \frac{1}{\sqrt{K}}\right)^2 (C^2 f^2)$$

wherein $\mu$ is electron mobility for a MOSFET in the reference current generation circuit, Cox is gate oxide film capacitance per unit area for said MOSFET, W/L is an aspect ratio for said MOSFET, K is a size ratio of said MOSFET to another MOSFET in the reference current generation circuit, C is a capacitance of equally-sized multiple capacitors in a switched-capacitor resistor within the reference current generation circuit, and f is the frequency of the clock signal.

8. A reference current generation circuit for a delta-sigma analog-to-digital converter, comprising: a switched-capacitor resistor having multiple switches controlled by a clock signal and including multiple capacitors coupled to at least some of said switches;
a first MOSFET coupled to the switched-capacitor resistor and to a different capacitor;
a second MOSFET coupled to the first MOSFET and further coupled to said different capacitor, said first and second MOSFETS of the same type;
a third MOSFET coupled to the first MOSFET, to a fourth MOSFET, and to said different capacitor, said fourth MOSFET coupled to the second MOSFET and being of the same type as the third MOSFET; and
a fifth MOSFET of the same type as the third and fourth MOSFETs, coupled to the third MOSFET and producing a reference current, wherein the reference current is proportional to a square of a frequency of the clock signal.

9. The circuit of claim 8, further comprising another capacitor coupled to the first MOSFET and to a node at which two of the multiple switches couple to each other, such that said another capacitor is in parallel with the switched-capacitor resistor.

10. The circuit of claim 8, wherein the fifth MOSFET is coupled to a current mirror that mirrors said reference current.

11. The circuit of claim 8, wherein each of the multiple switches is controlled by said clock signal or by a different clock signal, and wherein the clock signals have the same frequency.

12. The circuit of claim 11, wherein the phases of the clock signals are offset by 180 degrees.

13. The circuit of claim 8, wherein the third and fourth MOSFETs are equally sized.

14. The circuit of claim 8, wherein said multiple capacitors in the switched-capacitor resistor are equally sized.

15. The circuit of claim 8, wherein the reference current equals:

$$\frac{8}{\mu_N (Cox) \left(\frac{W}{L}\right)_{MN1}} \left(1 - \frac{1}{\sqrt{K}}\right)^2 (C^2 f^2)$$

wherein $\mu$ is electron mobility for the second MOSFET, Cox is gate oxide film capacitance per unit area for the second MOSFET, W/L is an aspect ratio for the second MOSFET, K is a size ratio of the first MOSFET to the second MOSFET, C is a capacitance of the equally-sized multiple capacitors in the switched-capacitor resistor, and f is the frequency of the clock signal.

16. The circuit of claim 8, further comprising a low-pass filter positioned between the third and fifth MOSFETs.

17. The circuit of claim 16, wherein the low-pass filter comprises a plurality of resistors and a plurality of capacitors, each of said capacitors coupled between a different pair of said resistors.

18. The circuit of claim 8, wherein the fifth MOSFET couples to a sixth MOSFET, said sixth MOSFET emits a constant current that combines with the reference current to produce a modified reference current.

19. The circuit of claim 18, wherein the constant current is produced independent of the frequency of the clock signal.

20. The circuit of claim 8, wherein the second and fourth MOSFETs couple to a startup circuit, and wherein the startup circuit comprises:
- a first p-type MOSFET coupled to a second p-type MOSFET;
- a capacitor coupled to the second p-type MOSFET;
- a third p-type MOSFET coupled to the capacitor;
- a first n-type MOSFET coupled to the third p-type MOSFET and coupled to the first p-type MOSFET; and
- a second n-type MOSFET coupled to the second p-type MOSFET and coupled to the first n-type MOSFET.

\* \* \* \* \*